United States Patent
Cheng

(10) Patent No.: US 10,418,998 B1
(45) Date of Patent: Sep. 17, 2019

(54) LEVEL SHIFTER CIRCUIT AND METHOD THEREOF

(71) Applicant: Novatek Microelectronics Corp., Hsinchu (TW)

(72) Inventor: Yen-Cheng Cheng, Hsinchu County (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 16/121,638

(22) Filed: Sep. 5, 2018

(51) Int. Cl.
   *H03K 19/0185* (2006.01)
   *H03K 3/356* (2006.01)

(52) U.S. Cl.
   CPC ........... *H03K 19/018521* (2013.01); *H03K 3/356104* (2013.01)

(58) Field of Classification Search
   None
   See application file for complete search history.

(56) References Cited

U.S. PATENT DOCUMENTS

| | | | | |
|---|---|---|---|---|
| 2009/0002027 A1* | 1/2009 | Lee | ............... | H03K 3/356113 326/80 |
| 2015/0180474 A1* | 6/2015 | Mathur | ............ | H03K 19/0175 326/81 |
| 2015/0229302 A1* | 8/2015 | Kim | ................ | H03K 5/2481 327/52 |
| 2015/0311875 A1* | 10/2015 | Chen | .................. | G11C 7/065 327/52 |

* cited by examiner

*Primary Examiner* — Crystal L Hammond
(74) *Attorney, Agent, or Firm* — JCIPRNET

(57) ABSTRACT

A level shifter circuit which includes a cross-coupled latch and a set-reset latch is introduced. The level shifter circuit includes a first input node, a second input node and a plurality of switches. The first input node and the second input node are configured to receive a first digital input signal and a second digital input signal, respectively. The plurality of switches are configured to be switched on or off according to at least one control signal to output a first output signal and a second output signal. The set-reset latch is coupled to the cross-coupled latch and includes a set input node, a reset input node and an output node. The set input node and the reset input node are configured to receive the first output signal and the second output signal of the cross-coupled latch, respectively. The output node outputs a level-shifted output signal according to the first output signal and the second output signal of the cross-coupled latch. A method adapted to a level shifter circuit is also introduced.

16 Claims, 4 Drawing Sheets

LEVEL SHIFTER CIRCUIT AND METHOD THEREOF

BACKGROUND

Technical Field

The disclosure generally relates to a level shifter circuit and a method thereof, and more particularly relates to a level shifter circuit having a latch function and an operative method of the level shifter circuit.

Description of Related Art

Level shifter circuits are used as interface circuits for bridging circuits or devices operating in different voltage level ranges. For example, the level shifter circuits are used to interface a first circuit with a second circuit, in which the first circuit may require a digital signal with a logic one voltage level higher than the logic one voltage level used by the second circuit.

Typically, a level shifter circuit does not have a latch function, and level-shifted output signals of the level shifter are asymmetric (e.g., output signal falling fast and rising slowly). The asymmetry of the level-shifted output signal may cause a malfunction of the cascaded circuit. In addition, the level shifter circuit is affected by short circuit issue caused by cross-coupled transistors in the level shifter circuit. The short circuit issue may cause high power consumption and overheat issues.

Therefore, it is desirable to have a level shifter circuit having a latch function and having capabilities of outputting symmetric output signals and saving power consumption.

Nothing herein should be construed as an admission of knowledge in the prior art of any portion of the present disclosure.

SUMMARY

A level shifter circuit having a latch function is introduced. The level shifter circuit includes a cross-coupled latch and a set-reset latch. The cross-coupled latch includes a first input node configured to receive a first digital input signal, a second input node configured to receive a second digital input signal and a plurality of switches. The plurality of switches are configured to be switched on or off according to at least one control signal to output a first output signal and a second output signal. The set-reset latch that is coupled to the cross-coupled latch includes a set input node, a reset input node and an output node. The set input node is configured to receive the first output signal; and the reset input node is configured to receive the second output signal. The output node is configured to output a level-shifted output signal according to the first output signal and the second output signal.

A method which is adapted to a level shifter circuit having a cross-coupled latch and a set-reset latch is also introduced. The method includes steps of receiving a first digital input signal onto a first input node of the cross-coupled latch and receiving a second digital input signal onto a second input node of the cross-coupled latch, controlling a plurality of switches of the cross-coupled latch to output a first output signal and a second output signal, receiving the first output signal onto a set input node of the set-reset latch and receiving the second output signal onto a reset input node of the set-reset latch, and outputting a level-shifted output signal according to the first output signal and the second output signal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
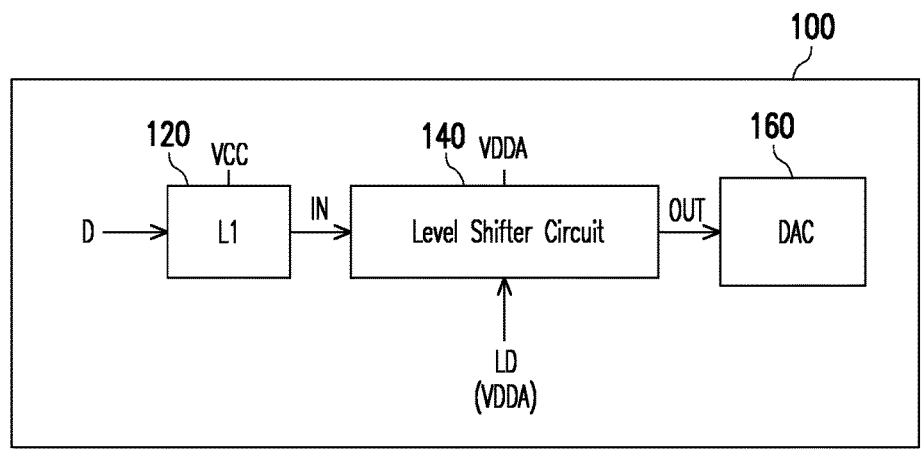
FIG. 1 is a schematic diagram that illustrates an electronic apparatus including a level shifter circuit according to an embodiment of the invention.

Referring to FIG. 1, an electronic apparatus 100 includes a latch 120, a level shifter circuit 140 and a digital-to-analog converter (DAC) 160. The electronic apparatus 100 may be a source driver for driving a display panel (not shown), but the invention is not limited thereto. The latch 120 is configured to receive a digital signal (or digital data) D and a supply voltage VCC, and hold the digital signal based on the supply voltage VCC. The latch 120 provides the digital signal IN to the level shifter circuit 140. The digital signal IN serves as an input signal of the level shifter circuit 140.

The level shifter circuit 140 receives the input signal IN, a supply voltage VDDA and a control signal LD. The level shifter circuit 140 is configured to translate the input signal IN to a level-shifted output signal OUT based on the control signal LD and the supply voltage VDDA. The voltage level of the supply voltage VDDA may be different from the voltage level of the supply voltage VCC; and the voltage level range of the input signal IN is different from a voltage level range of the level-shifted output signal OUT. For example, the logic one voltage level of the digital signal IN is determined according to the supply voltage VCC; and the logic one voltage level of the digital signal OUT is determined according to the supply voltage VDDA.

The level-shifted output signal OUT may be provided to the DAC 160 which is configured to convert the level-shifted output signal OUT from a digital form to an analog form. The DAC 160 are provided for the illustration purpose only, and the level-shifted output signal OUT which is outputted by the level shifter circuit 140 may be provided to any other circuits or devices.

Figure 2A:
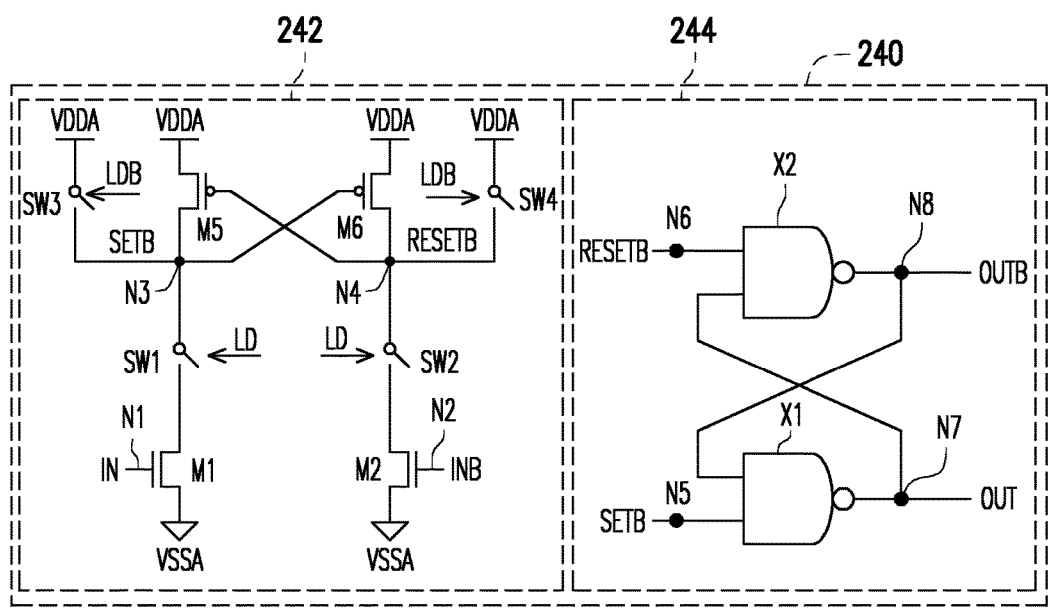
FIG. 2A is a schematic diagram that illustrates a level shifter circuit according to an embodiment of the invention.

Referring to FIG. 2A, a level shifter circuit 240 includes a cross-coupled latch 242 and a set-reset latch 244 coupled to the cross-coupled latch 242. The cross-coupled latch 242 includes a first input node N1, a second input node N2 and a plurality of switches SW1 to SW4. The first input node N1 is configured to receive a first digital input signal IN and the second input node N2 is configured to receive a second digital input signal INB. The first input signal IN may be an inverted signal of the second input signal INB.

The digital input signals IN and INB may be coupled to the control terminals of transistors M1 and M2, respectively. The other terminals of the transistor M1 are coupled to a power supply node to receive a supply voltage VSSA and the switch SW1, respectively. The other terminals of the transistor M2 are coupled to the power supply node to receive the supply voltage VSSA and the switch SW2, respectively.

The switch SW1 is coupled between transistor M1 and a first output node N3, and is controlled to switch on or off according to the control signal LD. The gate terminal of the transistor M1 is coupled to the first input node N1 to receive the first digital input signal IN. The switch SW2 is coupled between transistor M2 and the second output node N4, and is controlled to switch on or off according to the control signal LD. The gate terminal of the transistor M2 is coupled to the second input node N2 to receive the second digital input signal INB. The switch SW3 is coupled between the first output node N3 and the power supply node to receive the supply voltage VDDA, and is controlled to switch on or off according to a control signal LDB. The switch SW4 is coupled between the second output node N4 and the power supply node to receive the supply voltage VDDA, and is controlled to switch on or off according to the control signal LDB. The control signal LDB may be an inverted signal of the control signal LD.

The cross-coupled latch 242 may further include a cross-coupled transistor pair M5 and M6. The transistor M5 has a first terminal coupled to a power supply node to receive the supply voltage VDDA, a second terminal coupled to the first output node N3, and a control terminal coupled to the second output node N4. The transistor M6 has a first terminal coupled to the power supply node to receive the supply voltage VDDA, a second terminal coupled to the second output node N4, and a control terminal coupled to the first output node N3. As shown in FIG. 2A, the transistors M5 and M6 are p-type transistors, but the invention is not limited to any type of transistors M5 and M6.

The cross-coupled latch 242 is configured to output a first output signal SETB and a second output signal RESETB at the first and second output nodes N3 and N4, respectively. The values of the first and second output signals SETB and RESETB are controlled by switching on and off the switches SW1 to SW4, where the switches SW1 to SW4 are controlled by the control signals LD and LDB.

The set-reset latch 244 includes a set input node N5, a reset input node N6, and output nodes N7 and N8. The set input node N5 is electrically coupled to the first output node N3 of the cross-coupled latch 242 to receive the first output signal SETB. The reset input node N6 is electrically coupled to the second output node N4 of the cross-coupled latch 242 to receive the second output signal RESETB.

The set-reset latch 244 may further include a first logic circuit X1 and a second logic circuit X2, where the first logic circuit X1 is cross-coupled to the second logic circuit X2. Particularly, an output of the first logic circuit X1 is coupled to an input of the logic circuit X2, and an output of the second logic circuit X2 is coupled to an input of the logic circuit X1. The first logic circuit X1 receives the first output signal SETB and an output signal OUTB, and is configured to perform a logic operation on the received signal SETB and OUTB to generate an output signal OUT. The second logic circuit X2 receives the second output RESETB and the output signal OUT, and is configured to perform a logic operation on the received signals RESETB and OUT to generate the output signal OUTB. The output signals OUT and OUTB are the level-shifted output signals of the level shifter circuit 240. In an embodiment of the invention, the first logic circuit X1 and the second logic circuit X2 are NAND logic gates, but the invention is not limited thereto.

Figure 2B:
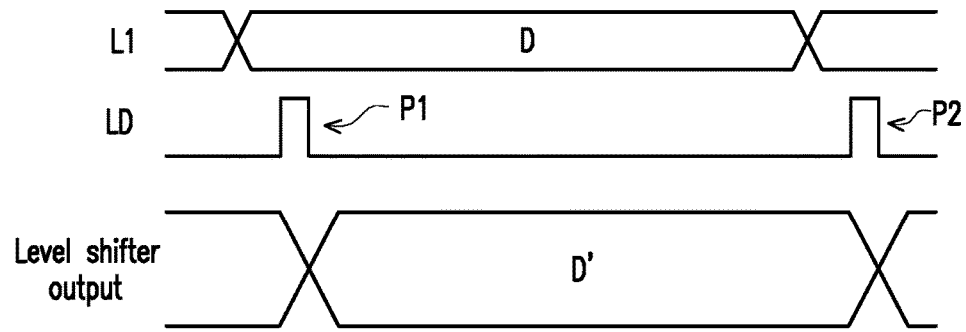
FIG. 2B is a waveform diagram that illustrates signals of an electronic apparatus having a level shifter circuit according to an embodiment of the invention.

FIG. 2B illustrates a waveform diagram of signals in an electronic apparatus according to an embodiment of the invention. The latch L1 (or the latch 120 as shown in FIG. 1) holds the digital data D. The control signal LD may include a plurality of pulses P1 and P2 which are used to control the operations of switches in the level shifter circuit. In response to the pulses P1 and P2 of the control signal LD, the level shifter circuit may perform a level shifting function to translate the digital data D to the digital data D', where the voltage level of logic state one of the digital data D is different from the voltage level of the logic state one of the digital data D'.

Referring to FIG. 2A and FIG. 2B, the control signal LD and its inverted signal LDB are used to control the switching functions of the switches SW1 to SW4. The switches SW1 and SW2 are controlled to switch on or off according to the same control signal LD; and the switches SW3 and SW4 are controlled to switch on or off according to the same inverted control signal LDB.

Figure 3A:
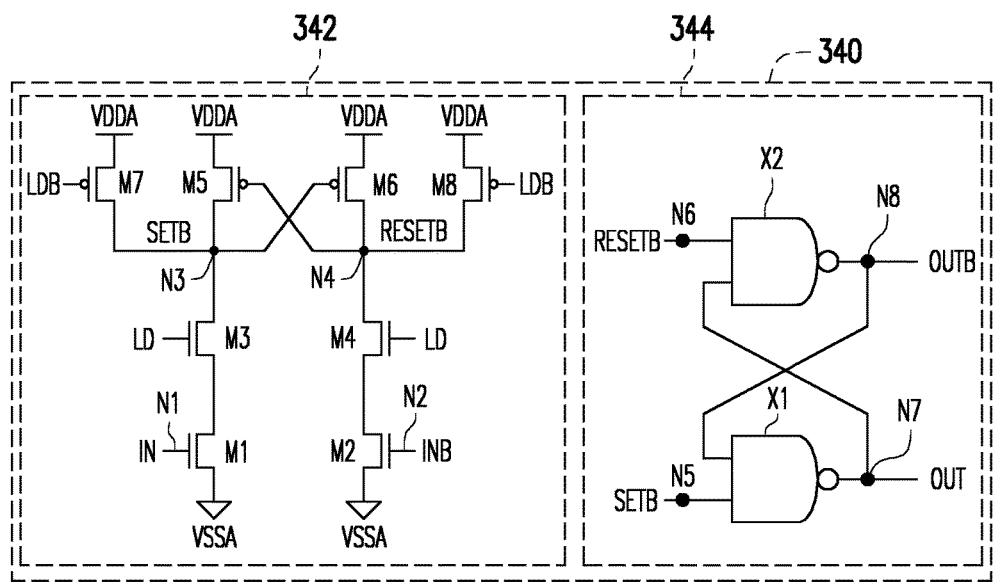
FIG. 3A is a schematic diagram that illustrates of a level shifter circuit according to an embodiment of the invention.

Referring to FIG. 3A, a level shifter circuit 340 includes a cross-coupled latch 342 and a set-reset latch 344. The difference between the level shifter circuit 340 in FIG. 3A and the level shifter circuit 240 in FIG. 2A is that the level shifter circuit 340 includes transistors M3, M4, M7 and M8 which are served as the switches SW1, SW2, SW3 and SW4, respectively. The transistor M3 has a first terminal coupled to the transistor M1, a second terminal coupled to the first output node N3 of the cross-coupled latch 342, and a control terminal received the control signal LD. The transistor M4 has a first terminal coupled to the transistor M2, a second terminal coupled to the second output node N4 of the cross-coupled latch 340, and a control terminal receives the control signal LD.

The transistor M7 has a first terminal coupled to a power supply node to receive the supply voltage VDDA, a second terminal coupled to the first output node N3, and a control terminal received an inverted control signal LDB. The transistor M8 has a first terminal coupled to the power supply node to receive the supply voltage VDDA, a second terminal coupled to the second output node N4, and a control terminal received the inverted control signal LDB.

In the level shifter circuit 340, the first and second output signals SETB and RESETB at the output nodes N3 and N4 are determined according to the digital input signals IN and INB, and the control signals LD and LDB. The set-reset latch 344 performs the latch operation on the first and second output signals SETB and RESETB to generate the output signals OUT and OUTB.

Figure 3B:
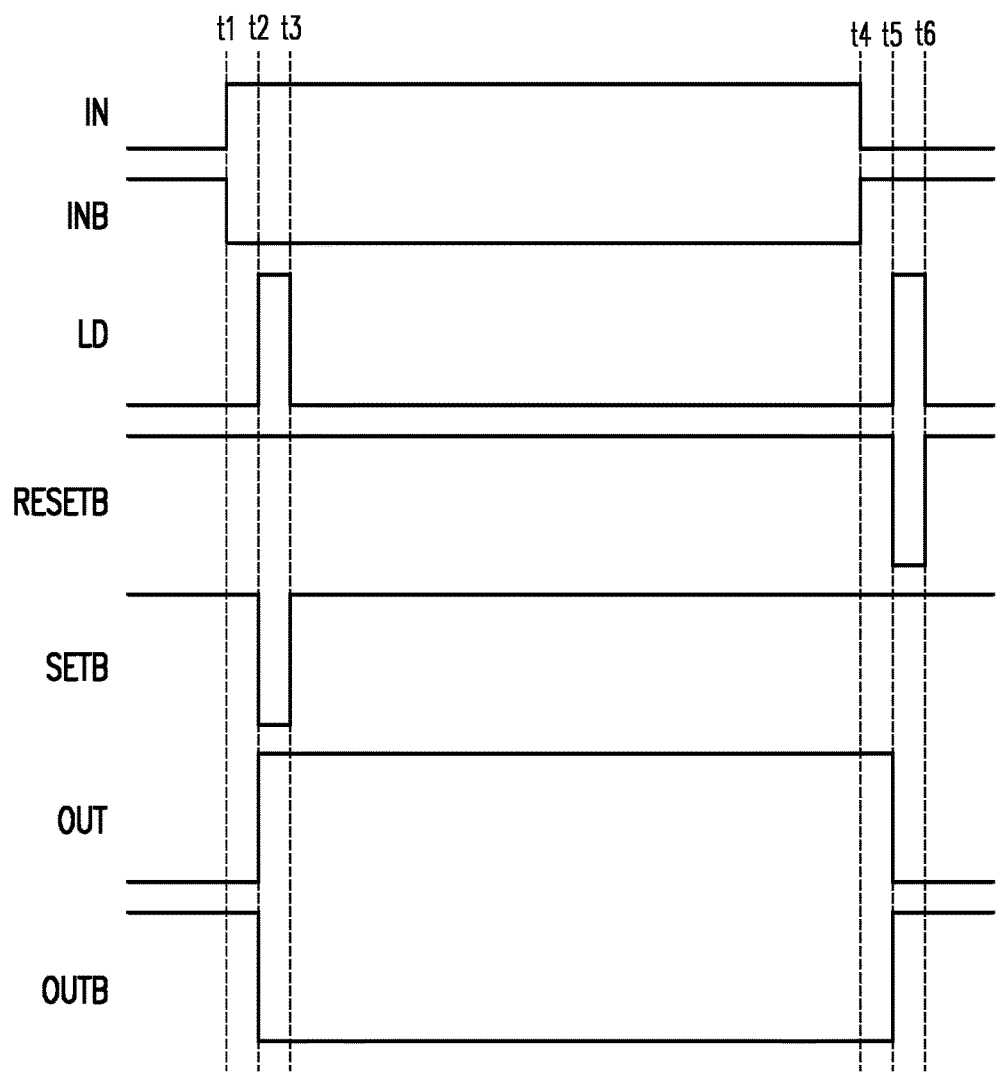
FIG. 3B illustrates a waveform diagram that illustrates signals in a level shifter circuit according to an embodiment of the invention.

In FIG. 3B, a waveform diagram of signals in a level shifter circuit is illustrated. Referring to FIG. 3A and FIG. 3B, prior to a time point t1, the control signal LD is in a low logic state (e.g., logic state "0") and the input signal IN is in the low logic state, the transistors M3 and M4 are switched off and the transistors M7 and M8 are switched on. The output nodes N3 and N4 are electrically isolated from the nodes N1 and N2, and the output nodes N3 and N4 are electrically coupled to the power supply nodes the supply voltage VDDA. As a result, the output signals SETB and RESETB are at the high logic state, and the states of the output signal OUT and OUTB remain unchanged.

At the time point t1, the input signal IN change the logic state from low to high and the control signal LD remains at the low logic state, the output signals SETB and RESETB are at the high logic state and the states of the output signal OUT and OUTB remain unchanged.

At the time point t2, the control signal LD changes from the low logic state to the high logic state, thereby switching on the transistors M3 and M4, and switching off the transistors M7 and M8. The output nodes N3 and N4 are now isolated from the power supply node and electrically coupled to the input nodes N1 and N2. The states of the output signals SETB and RESETB at the output nodes N3 and N4 are determined according to the states of the input signals IN and INB, respectively. The set-reset latch 344 performs the latch operation according to the states of the output signals SETB and RESETB. For example, when SETB is in the high logic state and RESETB is in the low logic state, the output signal OUT is in the low logic state. On the other hand, when SETB is in the low logic state and RESETB is in the high logic state, the output signal OUT is in the high logic state.

At the time point t3, the control signal LD is changed to the low logic state, then both of the output signals SETB and RESETB are in the high logic state. The set-reset latch 344 does not perform the latch operation, and the output signals OUT and OUTB remain unchanged.

At the time point t4, even though the input signal IN is changed to the low state, the control signal LD is still the in the low state, the signals SETB and RESETB are at the high logic state, and the output signals OUT and OUTB remain unchanged.

At the time point t5, the control signal LD changes to the high logic state, the RESETB is changed to the low logic state and SETB is remained at the high logic state. The set-reset latch perform the latch operation to change the output signal from the high logic state to the low logic state.

At the time point t6, the control signal LD changes to the low logic state, the signals SETB and RESETB remain at the high logic state, and the output signals OUT and OUTB remain unchanged.

Figure 4:
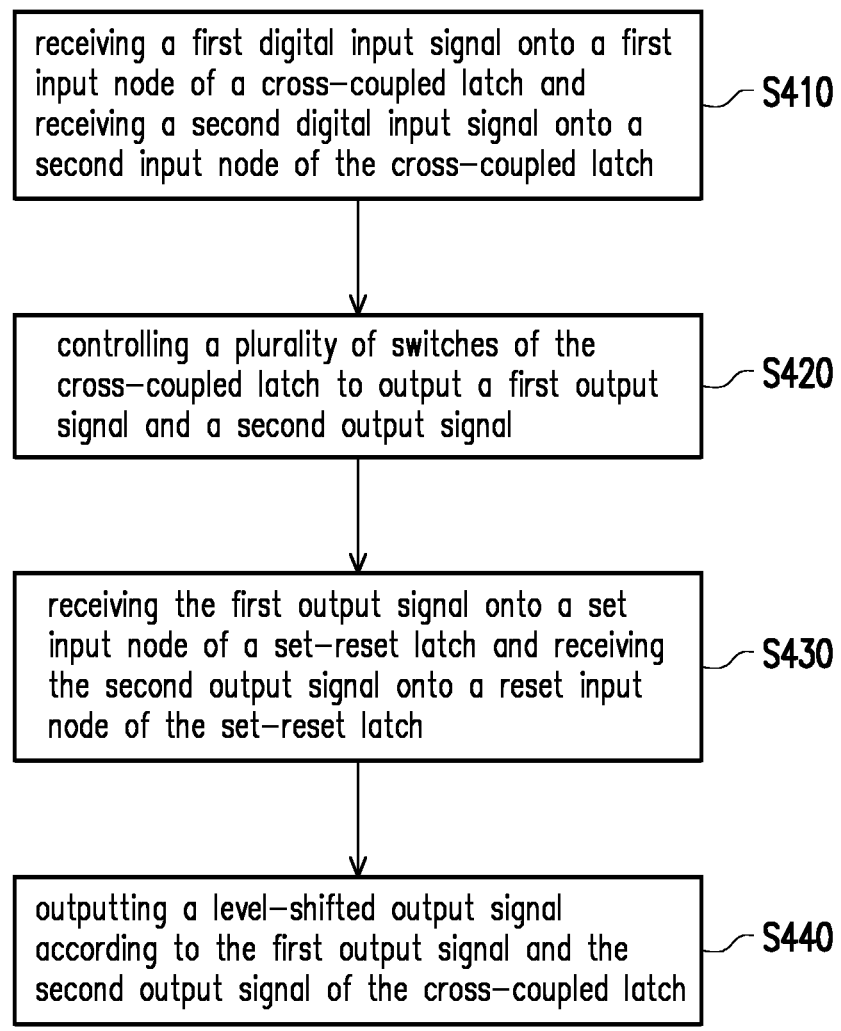
FIG. 4 is a flowchart diagram that illustrates a method adapted to a level shifter circuit according to an embodiment of the invention.

Referring to FIG. 4, a method adapted to a level shifter circuit according to an embodiment of the invention is illustrated. In steps S410, a first digital input signal is received onto a first input node of the cross-coupled latch and a second digital input signal is received onto a second input node of the cross-coupled latch.

In step S420, a plurality of switches of the cross-coupled latch are controlled to output a first output signal and a second output signal. The plurality of switches may be controlled according different control signals.

In step S340, the first output signal is received onto a set input node of the set-reset latch and the second output signal is received onto a reset input node of the set-reset latch. In step S350, a level-shifted output signal is output according to the first output signal and the second output signal.

From the above embodiments, a latch (e.g., set-reset latch) is integrated into the level shifter circuit, thereby providing a latch function for a level shifter circuit and reducing the occupied area in a circuit board. Since the level-shifted output signals are obtained according to the latch function, the symmetry of the level-shifted output signals is obtained. In addition, a plurality of switches are configured in the level shifter circuit, thereby preventing the short circuit issues and reducing the power consumption. In this way, the performance of the level-shifter circuit is improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A level shifter circuit, comprising:
a cross-coupled latch, comprising:
 a first input node, configured to receive a first digital input signal;
 a second input node, configured to receive a second digital input signal;
 a plurality of switches, configured to be switched on or off according to at least one control signal to output a first output signal and a second output signal,
a set-reset latch, coupled to the cross-coupled latch, comprising:
 a set input node, configured to receive the first output signal;
 a reset input node, configured to receive the second output signal; and
 an output node, outputting a level-shifted output signal according to the first output signal and the second output signal of the cross-coupled latch,
wherein the cross-coupled latch further comprises a first output node, a second output node, a first transistor and a second transistor, the plurality of switches comprises a first switch and a second switch,
wherein the first switch is coupled between the first transistor and the first output node, the first transistor is controlled by the first digital input signal, the set input node of the set-reset latch is coupled to the first output node of the cross-coupled latch;
wherein the second switch is coupled between the second transistor and the second output node, the second transistor is controlled by the second digital input signal, the reset input node of the set-reset latch is coupled to the second output node of the cross-coupled latch,
wherein the at least one control signal comprises a first control signal and a second control signal, the first switch and the second switch are controlled by the first control signal.

2. The level shifter circuit of claim 1, wherein
the first digital input signal is an inverted signal of the second digital input signal,
a voltage level range of the first digital input signal is different from a voltage level range of the level-shifted output signal.

3. The level shifter circuit of claim 1, wherein
the plurality of switches further comprises a third switch and a fourth switch,
the third switch is coupled between the first output node and a power supply node; and
the fourth switch is coupled between the second output node and the power supply node.

4. The level shifter circuit of claim 3, wherein the third switch and the fourth switch are controlled by the second control signal, and the second control signal is an inverted signal of the first control signal.

5. The level shifter circuit of claim 4, wherein
when the second control signal is in a first logic state, the first switch and the second switch are switched off, the third switch is switched on to electrically connect the first output node to the power supply node, and the fourth switch is switched on to electrically connect the second output node the power supply node, and
when the second control signal is in a second logic state, the third switch and the fourth switch are switched off, the first switch is switched on to electrically connect the first output node to the first input node, and the second switch is switched on to electrically connect the second output node to the second input node.

6. The level shifter circuit of claim 5, wherein
when the second control signal is in the first logic state, the first output signal and the second output signal are in the first logic state, and
when the first control signal is in the second logic state, the first output signal is determined according to the first digital input signal and the second output signal is determined according to the second digital input signal.

7. The level shifter circuit of claim 6, wherein
when the first output signal and the second output signal are in the same logic state, the set-reset latch does not perform the latch operation, and
when the first output signal and the second output signal are in different logic states, the set-reset latch performs the latch operation to output the level-shifted output signal.

8. The level shifter circuit of claim 3, wherein
the first transistor has a first terminal coupled to the first switch, a second terminal coupled to a ground node, and a control terminal coupled to the first input node to receive the first digital input signal,
the second transistor has first terminal coupled to the second switch, a second terminal coupled to the ground node, and a control terminal coupled to the second input node to receive the second digital input signal, and
the first transistor and the second transistor are n-type transistors.

9. The level shifter circuit of claim 8, wherein the cross-coupled latch further comprises:
a third transistor, having a first terminal coupled to a power supply node, a second terminal coupled to the first output node, and a control terminal coupled to the second output node; and
a fourth transistor, having a first terminal coupled to the power supply node, a second terminal coupled to the second output node, and a control terminal coupled to the first output node, wherein the third transistor and the fourth transistor are p-type transistors.

10. The level shifter circuit of claim 9, wherein the first logic circuit and the second logic circuit are NAND gates.

11. The level shifter circuit of claim 1, wherein
the set-reset latch comprises a first logic circuit and a second logic circuit,
an output terminal of the first logic circuit is electrically connected to an input terminal of the second logic circuit, and
an output terminal of the second logic circuit is electrically connected to an input terminal of the first logic circuit.

12. A method, adapted to a level shifter circuit having a cross-coupled latch and a set-reset latch, comprising:
receiving a first digital input signal onto a first input node of the cross-coupled latch and receiving a second digital input signal onto a second input node of the cross-coupled latch,
controlling a plurality of switches of the cross-coupled latch to output a first output signal and a second output signal;
receiving the first output signal onto a set input node of the set-reset latch and receiving the second output signal onto a reset input node of the set-reset latch; and
outputting a level-shifted output signal according to the first output signal and the second output signal of the cross-coupled latch,
wherein the cross-coupled latch further comprises a first output node, a second output node, a first transistor and a second transistor, the plurality of switches comprises a first switch and a second switch,
wherein the first switch is coupled between the first transistor and the first output node, the first transistor is controlled by the first digital input signal, the set input node of the set-reset latch is coupled to the first output node of the cross-coupled latch;
wherein the second switch is coupled between the second transistor and the second output node, the second transistor is controlled by the second digital input signal, the reset input node of the set-reset latch is coupled to the second output node of the cross-coupled latch,
wherein the at least one control signal comprises a first control signal and a second control signal, the first switch and the second switch are controlled by the first control signal.

13. The method of claim 12, wherein the first digital input signal is an inverted signal of the second digital input signal, and a voltage level range of the first digital input signal is different from a voltage level range of the level-shifted output signal.

14. The method of claim 12, wherein
a control terminal of the first transistor is coupled to the first input node to receive the first digital input signal,
a control terminal of the second transistor is coupled to the second input node to receive the second digital input signal,
the plurality of switches further includes a third switch and a fourth switch,
the third switch is coupled between the first output node and a power supply node and is controlled by a second control signal,
the fourth switch is coupled between the second output node and the power supply node and is controlled by the second control signal, and
the second control signal is an inverted signal of the first control signal.

15. The method of claim 14, wherein
when the second control signal is in a first logic state, the first switch and the second switch are switched off, the third switch and the fourth switch are switched on, and the first output signal and the second output signal are in the first logic state; and when the second control signal is in a second logic state, the first switch and the second switch are switched on, the third switch and the fourth switch are switched off, the first output signal is determined according to the first digital input signal, and the second output signal is determined according to the second digital input signal.

16. The method of claim 15, wherein when the first output signal and the second output signal are in the same logic state, the set-reset latch does not perform a latch operation, and when the first output signal and the second output signal are in different logic states, the set-reset latch performs the latch operation to output the level-shifted output signal.

* * * * *